United States Patent
Betsuyaku

Patent Number: 5,887,721
Date of Patent: Mar. 30, 1999

[54] WAFER CARRIER BOX

[75] Inventor: Takashi Betsuyaku, Niigata-ken, Japan

[73] Assignees: Shin-Etsu Polymer Co., Ltd.; Shin-Etsu Handotai Co., Ltd., both of Tokyo, Japan

[21] Appl. No.: 69,106

[22] Filed: Apr. 29, 1998

[30] Foreign Application Priority Data

May 7, 1997 [JP] Japan .................................. 9-131659

[51] Int. Cl.⁶ .................................................. B65D 85/00
[52] U.S. Cl. ......................... 206/711; 206/454; 206/756
[58] Field of Search ................................... 206/710, 711, 206/723, 454, 756, 764, 45.24

[56] References Cited

U.S. PATENT DOCUMENTS

| | | | |
|---|---|---|---|
| 335,178 | 2/1886 | Case et al. ........................... | 206/45.24 |
| 1,549,645 | 8/1925 | Windfuhr .............................. | 206/45.24 |
| 3,168,192 | 2/1965 | Nicholson et al. ................... | 206/45.24 |
| 4,049,114 | 9/1977 | Danheisser ........................... | 206/45.24 |
| 4,842,136 | 6/1989 | Nakazato et al. ..................... | 206/328 |
| 4,962,849 | 10/1990 | Anderson ............................. | 206/45.24 |
| 5,248,033 | 9/1993 | Kos et al. .............................. | 206/711 |

Primary Examiner—Paul T. Sewell
Assistant Examiner—Jila Mohandesi
Attorney, Agent, or Firm—Wenderoth, Lind & Ponack, L.L.P.

[57] ABSTRACT

A carrier box assembly for containing precision wafer materials in storage and transportation includes (a) an upwardly opening wafer cassette provided on inner surfaces of oppositely facing side walls thereof with sets of wafer-alignment grooves; (b) a box body for containing the wafer cassette and provided on the lower surface thereof with triangular standing props by which the box body can be placed on a horizontal surface with an inclination angle of 3 to 30 degrees; and (c) a covering mountable on the box body and coming into engagement with the box body by being moved in a direction parallel to the side walls of the box body. A wafer-pressing member of an elastic material is provided on the lower surface of the covering and has a set of wafer-receiving grooves formed on the lower surface thereof. By virtue of the coplanarity of the wafer materials held by the wafer-alignment grooves in an inclined disposition and the moving direction of the covering in mounting, the wafer materials resting in parallel on the downside walls of the inclined wafer-alignment grooves are kept safe from mechanical damages in packaging otherwise caused by the movement of the wafer-pressing member in a biased direction.

12 Claims, 3 Drawing Sheets

WAFER CARRIER BOX

BACKGROUND OF THE INVENTION

The present invention relates to a wafer carrier box for containing a plurality of precision substrate plates such as semiconductor silicon wafers, hard magnetic disks, fused silica glass plates for photomasks and the like with a purpose of storage and transportation.

The above mentioned precision substrate plates in electronic industries including, typically, semiconductor silicon wafers are generally fragile and susceptible to mechanical damage such as chipping and cracking by small shocks and vibrations encountered during transportation and must be kept absolutely free from contamination by the deposition of dust particles and the like. It is accordingly a usual practice, with a purpose to ensure safety and clean condition of the silicon wafers during storage and transportation, that wafer materials are contained in a wafer carrier box, as is illustrated in FIGS. 2A and 2B of the accompanying drawings, which consists of a wafer cassette 10, box body 20 and covering 30 each made from a plastic resin such as polypropylene by the method of injection molding.

In the above mentioned wafer carrier box, the wafer cassette 10 has a configuration of an approximately rectangular box or frame opening at the top and at the bottom and provided with sets of wafer-alignment grooves 11A each running in the vertical direction at a regular pitch on the two opposite side walls 11 (see FIG. 2C) each to receive the periphery of a wafer material P with a small play between the surface of the wafer material P and the walls of the groove 11A so as to hold a plurality of wafer materials P in alignment approximately each in an uprightly standing disposition.

The box body 20 is also in the form of an upwardly opening rectangular box consisting of a bottom wall 21 of an approximately uniform thickness and four side walls 22 surrounding the bottom wall 21. The plane formed by the periphery of the upper opening 23 is horizontal or in parallel to the bottom wall 21. A horizontally extending flange 24 is formed on and around the outer surface of the side walls 22 to receive the lower ends of the side walls 32 of the covering 30 when the covering 30 is mounted on the box body 20 to be fastened to the box body 20 by means of a clamping device (not shown in the figures). The wafer cassette 10 holding the wafer materials P is placed on the bottom wall 21 of the box body 20 and then the covering 30 is mounted over the opening 23 to ensure an air tight sealing condition with the flange 24.

The covering 30 consists of a top wall 31 and downwardly extending side walls 32 surrounding the top wall 31, and the covering 30 is engaged over the upper opening 23 of the box body 20. The top wall 31 of the covering 30 is provided on the lower surface thereof with a wafer-pressing member 39 made from an elastic material having a plurality of wafer-receiving grooves 39A each running in a direction within the plane defined by a pair of oppositely facing wafer-alignment grooves 11A on the side walls 11 of the wafer cassette 10 to receive the upper periphery of the wafer material P standing in the wafer cassette 10 keeping a small play with the walls of the wafer-receiving groove 39A.

A problem in the above described wafer carrier box of the prior art is that, as a consequence of the substantial play formed between the surfaces of the wafer material P and the walls of the wafer-alignment grooves 11A in which the wafer material P is inserted to take a vertical disposition, the wafer material P can be more or less inclined, as is shown in FIG. 2A, within the wafer cassette 10 in different directions from wafer to wafer. This random inclination of the wafer materials P in the wafer cassette 10 placed in the box body 20 sometimes causes a serious problem that, when the covering 30 is mounted over the upper opening 23 of the box body 20, as is illustrated in FIG. 2B, mismatching or improper contacting is unavoidable between the upper peripheries of the respective wafer materials P so that the respective wafer-receiving grooves 39A and the elevated ridgelines between two grooves 39A hit at the upper periphery of the wafer material P to cause mechanical damage to the wafer material P.

With an object to overcome the problems and disadvantage in the prior art wafer carrier box as described above, another wafer carrier box illustrated in FIGS. 3A and 3B has been proposed. In the wafer carrier box of this second prior art arrangement, the box body 20 has a bottom wall 21 which is not in a horizontal disposition but in an inclined disposition by an angle $\theta$ relative to the horizontal base surface L on which the box body 20 is standing by means of triangular fin-like props 21A having an apex angle $\theta$ while shorter and longer side walls 22A, 22B extend upright or perpendicularly to the base surface L to define a horizontal plane of the opening 23 with the upper peripheries of the side walls of the box body 20. The wafer-pressing member 39 provided on the lower surface of the covering 30 is also in an inclined disposition by the same angle $\theta$ by means of triangular props 31A so that each of the wafer-receiving grooves 39A can receive the upper periphery of the respective wafer material P. In this wafer carrier box, the wafer material P necessarily lies on the downside walls of the wafer-alignment grooves 11A so that mismatching can never be caused between the upper periphery of the wafer material P and the wafer-receiving grooves 39A in the wafer-pressing member 39 on the lower surface of the covering 30, so as to prevent the wafer materials P from eventually being damaged.

The wafer carrier box illustrated in FIGS. 3A and 3B, however, has a following problem. When a plurality of wafer materials P are mounted on the wafer cassette 10 in alignment by means of the wafer-alignment grooves 11A as is mentioned above and the covering 30 is mounted over the upper opening 23 of the box body 20 from above to be engaged at the lower ends of the side walls 32 with the flange 24 around the box body 20, the downward moving direction of the covering 30 and hence the downward moving direction of the wafer-pressing member 39 are not within the plane of the wafer materials P lying on the downside walls of the wafer-alignment grooves 11A. Thus, the upper periphery of the wafer material P is brought into contact with the wafer-receiving groove 39A first at the upside wall of the groove 39A before the covering 30 is completely engaged with the flange 24 and then is brought into contact with the bottom of the wafer-receiving groove 39A as the covering 30 is further moved downwardly to be fully engaged with the flange 24 around the box body 20. This can cause distortion or mechanical damage to the wafer material P under a pressing force in a biased direction.

SUMMARY OF THE INVENTION

An object of the present invention accordingly is to provide a novel wafer carrier box, which is an improved modification of the wafer carrier box illustrated in FIGS. 3A and 3B, free from the disadvantages and problems in the prior art wafer carrier boxes described above.

Thus, the wafer carrier box for containing wafer materials provided by the present invention is an assembly which comprises:

(a) an upwardly opening wafer cassette having a generally rectangular configuration in plan view and provided on the inner surfaces of the oppositely facing side walls thereof a set of wafer-alignment grooves running in the vertical direction for holding the wafer materials therein at the periphery of each wafer material received with play in the wafer-alignment grooves;

(b) an upwardly opening box body to contain the wafer cassette therein and having props by means of which, when the box body stands on a horizontal surface, the wafer cassette contained in the box body is held with the bottom surface of the cassette inclined at an angle of inclination in a range from 3 to 30 degrees relative to the horizontal surface on which the box body stands, the side walls of the box body being approximately in parallel to respective of the side walls of the wafer cassette; and (c) a covering mountable on the box body and having, on the lower surface of the top wall thereof, a wafer-pressing member provided on the lower surface thereof with wafer-receiving grooves each running within a plane defined by a pair of wafer-alignment grooves on the oppositely facing side walls of the wafer cassette. The covering comes into engagement over the upper opening of the box body by being moved in a direction substantially parallel to the side walls of the box body.

In the use of the above defined wafer carrier box for storage and transportation of precision wafer materials such as semiconductor silicon wafers, a plurality of the wafers are contained each within the wafer cassette with peripheries thereof inserted into the wafer-alignment grooves with small play, and the wafer cassette is contained within the box body keeping the side walls thereof parallel to the wafer materials in a tilted disposition so as to have the wafers each resting on the downside walls of the wafer-alignment grooves, followed by mounting of the covering which is moved in a direction just in parallel to the plane of the wafer materials bringing the wafer pressing grooves on the lower surface of the wafer pressing member into contact with the upper peripheries of the wafers. Accordingly, the wafer materials are protected from mechanical damage such as chipping and cracking as well as distortion due to improper relative position of the wafer materials and the wafer pressing grooves.

DETAILED DESCRIPTION OF THE PREFERRED EMBODIMENTS

In the following, the novel wafer carrier box of the present invention is illustrated in more detail by making reference to the accompanying drawings.

Figure 1A:
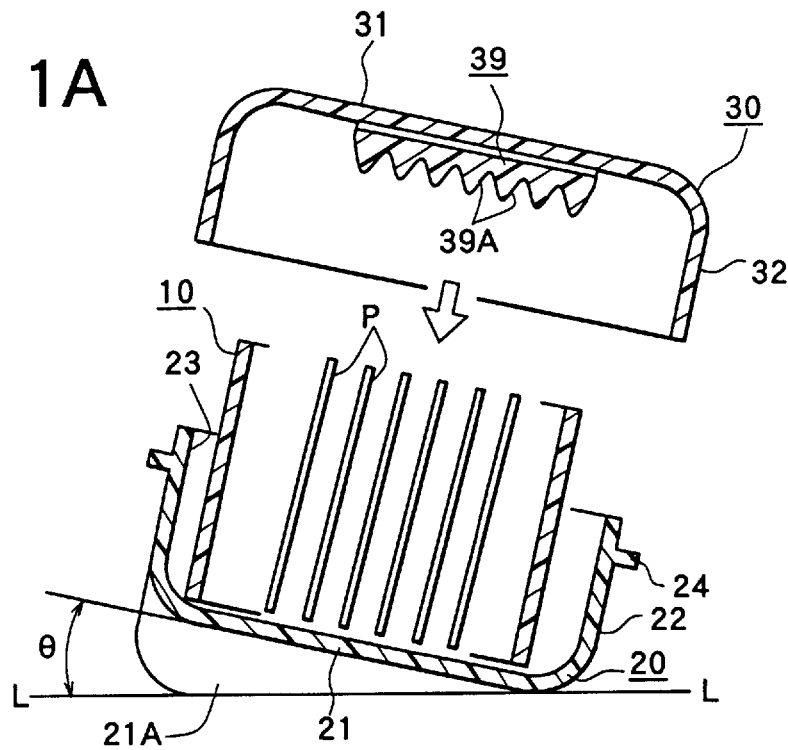
FIGS. 1A and 1B are vertical cross sectional views of the inventive wafer carrier box containing wafer materials with the covering lifted above and mounted on the box body, respectively.
Figure 1B:
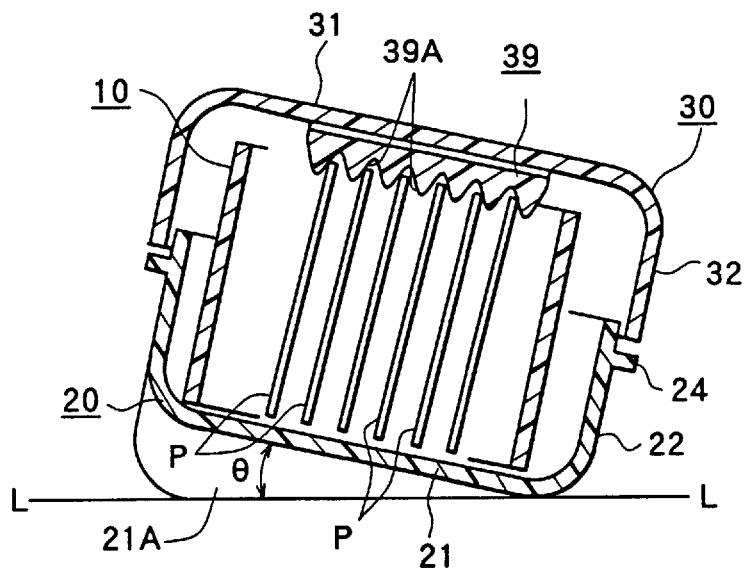

FIG. 1A and 1B are vertical cross sectional views of the inventive wafer carrier box which is an assembly consisting of a wafer cassette 10, box body 20 and covering 30, with the covering 30 shown lifted above and mounted on the box body 20, respectively, with wafer materials P added.

Figure 2A:
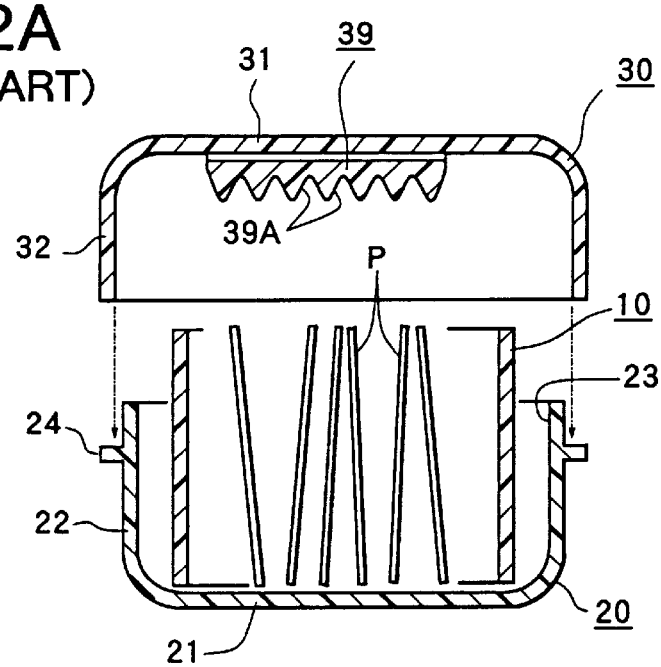
FIGS. 2A and 2B are vertical cross sectional views of a conventional wafer carrier box containing wafer materials with the covering lifted above and mounted on the box body, respectively.
Figure 2B:
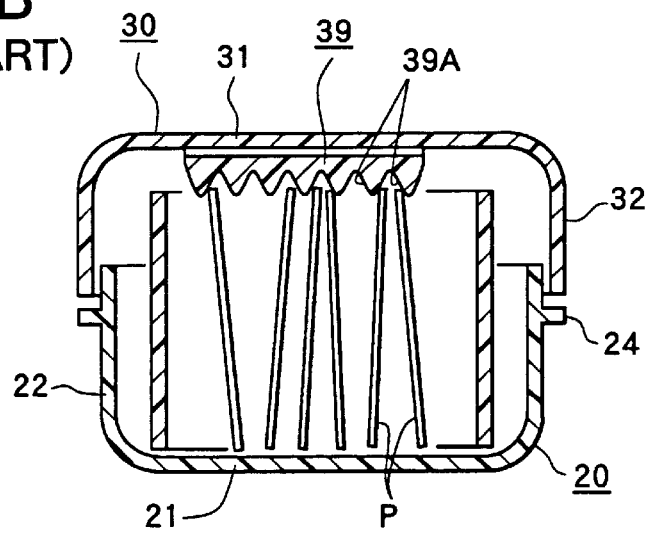
Figure 2C:
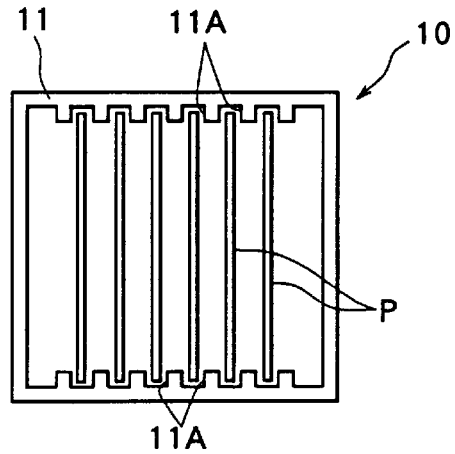
FIG. 2C is a plan view of the wafer cassette held in the wafer carrier box with wafer materials added.

The wafer cassette 10 per se can be about the same as in the prior art arrangement illustrated in plan view in FIG. 2C. Namely, the wafer cassette 10 has a configuration of an upwardly and downwardly opening frame with a generally rectangular configuration as viewed in plan and provided on the oppositely facing side walls 11 with sets of wafer-alignment grooves 11A at a regular pitch each running in an upward direction to receive the periphery of the wafer material P. The wafer-alignment groove 11A has a width somewhat larger than the thickness of the wafer material P inserted thereinto so that the wafer material P is held in the groove 11A with substantial play. It is sometimes advantageous with an object to improve stability of the wafer materials P held in the wafer-alignment grooves 11A that the lower part of each of the side walls 11 of the wafer cassette 10, on which the wafer-alignment grooves 11A are formed, has a curved configuration with about the same curvature as the contour of the wafer material P to be inserted into the wafer-alignment grooves 11A.

The box body 20, which is mounted on a horizontal surface L of a table to enable the wafer cassette 10 to be inserted therein onto a bottom wall 21 thereof and to be removed therefrom, has an upwardly opening configuration with a generally rectangular configuration as viewed in plan. It is optional that the wafer cassette 10 is not placed directly on the bottom wall 21 of the box body 20. Rather, the box body 20 may be provided on the inner surface with an inwardly extending flange (not shown in the figures) on which the wafer cassette 10 is mounted. Characteristically, the box body 20 is provided on the lower surface of the bottom wall 21 with two or more of standing props 21A by means of which the box body 20 can be placed on the horizontal surface L of a table in a manner keeping the bottom wall 21 in an inclined disposition by an angle of 3 to 30 degrees with the horizontal surface L. Hence, the wafer cassette 10 is held in the box body 20 in an inclined disposition with the same angle of inclination. By virtue of this inclined disposition of the wafer cassette 10, the wafer materials P held in the wafer-alignment grooves 11A always rest on the downside walls of the wafer-alignment grooves 11A to ensure good parallelism in the alignment of the wafer materials P held in the wafer-alignment grooves 11A. As is illustrated in FIG. 1A and 1B, two opposite side walls 22 of the box body 20 are inclined by the same angle as the inclination angle of the bottom wall 21.

Instead of providing the inclination props 21A on the lower surface of the bottom wall 21 of the box body 20, it is an alternative to have the bottom wall 21 of the box body biased relative to the side walls 22 with inclination props provided between the bottom wall 21 of the box body 20 and the bottom surface of the wafer cassette 10 so that the wafer cassette 10 contained in the box body 20 takes an inclined disposition with the side walls thereof each in parallel to one of the side walls 22 of the box body 20.

The form of the standing props 21A is not limited to the triangular fin-like configuration with an apex angle of 3 to 30 degrees illustrated in the figures but can be of any other form provided that the angle of inclination of the bottom wall 21 of the box body 20 can be ensured or that the wafer cassette 10 can be held in the box body 20 in the inclined disposition.

Figure 3A:
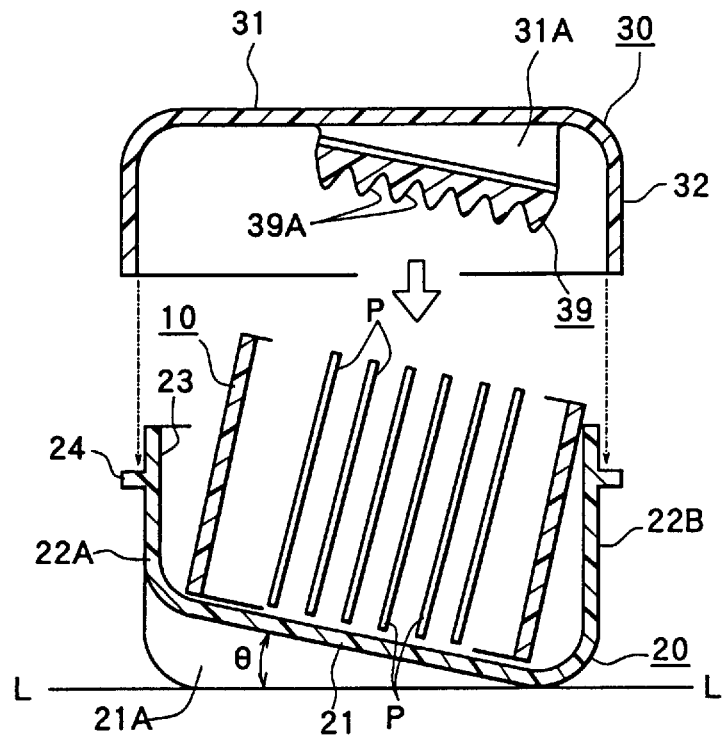
FIGS. 3A and 3B are vertical cross sectional views of a different wafer carrier box of the prior art containing wafer materials with the covering lifted above and mounted on the box body, respectively, with the lower surface of the bottom wall of the box body being inclined.
Figure 3B:
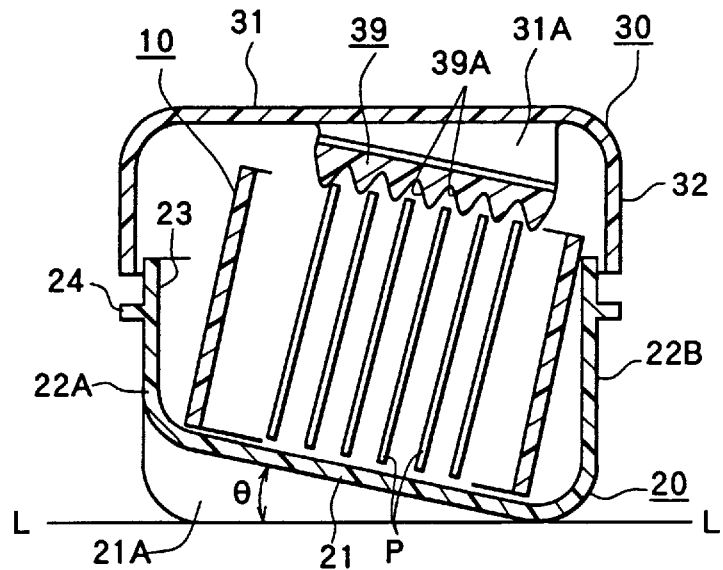

The cover or covering 30 is mounted over the upper opening 23 of the box body 20 and has side walls 32 in contact with the flange 24 around the box body 20. Cover 30 has a top wall 31 on the lower surface of the top wall 31 is a wafer-pressing member 39 having a plurality of wafer-receiving grooves 39A each extending in a direction within the plane defined by a respective pair of the opposite wafer-alignment grooves 11A on the walls 11 of the wafer cassette 10. Grooves 39A are spaced at the same pitch as that of the wafer-alignment grooves 11A. Different from the prior art illustrated in FIGS. 3A and 3B, the wafer-pressing member 39 extends parallel to the top wall 31 of the covering 30, and top wall 31 is inclined.

Accordingly, the upper periphery of each of the wafer materials P held in the wafer cassette 10 is received in one of the wafer-receiving grooves 39A with small play relative to the walls of the groove 39A so as to decrease vibration of the wafer materials P in the wafer cassette 10. When the covering 30 is brought over the upper opening 23 of the box body 20, the covering 30 is moved in a direction perpendicular to the bottom wall 21 of the box body 20 or, in other words, in a direction parallel to the plane of the wafer materials P positioned in the wafer cassette 10 or parallel to the inclined side walls 22 of the box body 20 as is shown by the arrow in FIG. 1A.

Though not shown in the figures, one or more clamping means are provided to the box body 20 and the covering 30, which serves to fasten the covering 30 to the box body 20 when the covering 30 is mounted over the upper opening 23 of the box body 20. Further, the box body 20 is optionally provided with a positioning means for the wafer cassette 10 which enables correct positioning of the wafer cassette 10 within the box body 20 so as to ensure coplanarity of the wafer-receiving groove 39A below the covering 30 with the plane defined by a respective pair of the wafer-alignment grooves 11A on the side walls 11 of the wafer cassette 10.

The wafer carrier box of the present invention described above is used for storage and transportation of various kinds of precision wafer materials such as semiconductor silicon wafers. In transportation of wafer materials P, the wafer materials P are first contained in the wafer cassette 10 in a parallel alignment with the periphery of each wafer material P inserted into the wafer-alignment grooves 11A on the side walls 11 of the wafer cassette 10 with small play which allows a small displacement, e.g., inclination, of the wafer materials P held in the wafer cassette 10.

Next, the wafer cassette 10 holding a plurality of wafer materials P in the above described manner is put into the box body 20 positioned on a horizontal surface of a table, with the bottom wall 21 of the box body 20 inclined at an angle of 3 to 30 degrees by standing props 21A. It is essential that the wafer cassette 10 is tilted or inclined at the same angle of inclination in such a fashion that the plane defined by a pair of wafer-alignment grooves 11A on the opposite side walls 11 is inclined at the same angle from an upright disposition so that each of the wafer materials P held in the wafer-alignment grooves 11A consequently resets on the downside walls of the wafer-alignment grooves 11A. Namely, the wafer materials P are all aligned within the wafer cassette 10 with the same regular pitch as the pitch of the wafer-alignment grooves 11A in an inclined disposition perpendicular to the inclined bottom wall 21 of the box body 20. When the inclination angle is too small, some of the wafer materials P will not rest on the downside walls of the respective wafer-alignment grooves 11A. When the inclination angle is too large, on the other hand, a trouble is sometimes caused in mounting of the covering 30 that the box body 20 slides on the table due to the resulting low-angle movement of the covering 30, thus causing a decrease in efficiency.

Thereafter, the covering 30 is mounted over the upper opening 23 of the box body 20 by being moved in a direction perpendicular to the inclined bottom wall 21 of the box body 20 or in parallel to the side walls 22 of the box body 20 so as to air-tightly seal the wafer materials P in the box body 20. Since the wafer materials P each lie within a plane in parallel to the moving direction of the covering 30 coplanarly with the wafer-receiving grooves 39A, the wafer materials P are safe from eventual mechanical damage or distortion due to improper contacting of the periphery of the wafer material P with the elevated ridgeline between the wafer-receiving grooves 39A or improper contacting with the walls of the wafer-receiving grooves 39A.

When the covering 30 is mounted on the box body 20, the wafer-pressing member 39 made from an elastic material gently presses the upper peripheries of the wafer materials P aligned in the wafer-alignment grooves 11A so that the wafer materials P, which otherwise are easily moved, are secured with resilience in the correct positions so that the risk of mechanical damage to the wafer materials P during transportation can be greatly decreased.

While in the above described embodiment of the inventive wafer carrier box the wafer cassette 10 is placed on the bottom wall 21 of the box body 20 to be secured in a correct position, it is optional that the box body 20 is provided on the side walls 22 with a cassette-securing means such as protrusions and flanges and the wafer cassette 10 is provided with an engagement means such as hanging hooks by which the wafer cassette 10 can be secured at the proper position.

What is claimed is:

1. A wafer carrier box for containing wafer materials, said box comprising:

an upwardly open wafer cassette having a generally rectangular configuration when viewed in plan, said cassette having spaced opposite first and second side walls having on inner surfaces thereof respective upwardly extending parallel wafer-alignment grooves, said wafer-alignment grooves in said first side wall being aligned with respective said wafer-alignment grooves in said second side wall and thereby forming pairs of wafer-alignment grooves to receive with play peripheries of respective wafer materials;

an upwardly open box body for supporting therein said cassette, said box body having structure ensuring that, when said box body is supported on a horizontal surface and when said cassette is supported in a supported position in said box body, a bottom of said cassette will be inclined at an angle to the horizontal and said first and second side walls of said cassette will be inclined at said angle to the vertical, and said box body having first and second side walls extending approximately parallel to said first and second side walls, respectively, of said cassette when said cassette is in said supported position; and a cover mountable on said box body in a mounted position covering an open upper end thereof, said cover being movable to said mounted position by being moved relative to said box body in a direction substantially parallel to said first and second side walls of said box body, said cover having a top wall having a lower surface having thereon a wafer-pressing member to confront upper portions of the peripheries of the wafer materials when said cassette containing the wafer materials is in said supported position, said wafer-pressing member having in a lower surface thereof a plurality of wafer-receiving grooves, each said wafer-receiving groove extending within a plane defined by a respective said pair of wafer-alignment grooves.

2. A wafer carrier box as claimed in claim 1, wherein said structure of said box body comprises a bottom wall of said box body, said bottom wall being inclined by said angle to the horizontal.

3. A wafer carrier box as claimed in claim 2, wherein, when said cassette is in said supported position, said bottom of said cassette is supported by said bottom wall.

4. A wafer carrier box as claimed in claim 1, wherein said structure of said box body includes at least one prop for supporting said box body on the horizontal surface such that a bottom wall of said box body is inclined by said angle to the horizontal.

5. A wafer carrier box as claimed in claim 4, wherein, when said cassette is in said supported position, said bottom of said cassette is supported by said bottom wall.

6. A wafer carrier box as claimed in claim 4, wherein said prop comprises a triangular fin having an apex angle equal to said angle.

7. A wafer carrier box as claimed in claim 1, wherein said angle is from 3 to 30 degrees.

8. A wafer carrier box as claimed in claim 1, wherein said top wall of said cover is inclined by said angle to the horizontal when said cover is in said mounted position.

9. A wafer carrier box as claimed in claim 1, wherein said cover further includes first and second side walls depending from said top wall, said first and second side walls of said cover being inclined by said angle to the vertical when said cover is in said mounted position.

10. A wafer carrier box as claimed in claim 9, wherein, when said cover is moved in said direction to said mounted position, said first and second side walls of said cover fit outwardly of and are guided by said first and second side walls, respectively, of said box body.

11. A wafer carrier box as claimed in claim 1, wherein said wafer-pressing member is formed of an elastic material.

12. A wafer carrier box as claimed in claim 1, wherein said plurality of wafer-receiving grooves all are aligned in a plane that extends parallel to said top wall of said cover.

* * * * *